(12) United States Patent
Yu (10) Patent No.: US 9,741,573 B2
(45) Date of Patent: Aug. 22, 2017

(54) NAND FLASH MEMORY AND FABRICATION METHOD THEREOF (71) Applicants: Semiconductor Manufacturing International (Beijing) Corporation, Beijing (CN); Semiconductor Manufacturing International (Shanghai) Corporation, Shanghai (CN)

(72) Inventor: Guo Bin Yu, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/356,176

(22) Filed: Nov. 18, 2016

(65) Prior Publication Data
US 2017/0194154 A1    Jul. 6, 2017

(30) Foreign Application Priority Data
Jan. 4, 2016 (CN) .......................... 2016 1 0005469

(51) Int. Cl.
*H01L 21/336* (2006.01)
*H01L 21/28* (2006.01)
*H01L 27/11524* (2017.01)
*H01L 27/1157* (2017.01)
*H01L 27/11551* (2017.01)
(Continued)

(52) U.S. Cl.
CPC .. *H01L 21/28273* (2013.01); *H01L 21/28282* (2013.01); *H01L 21/31105* (2013.01); *H01L 21/31144* (2013.01); *H01L 27/1157* (2013.01); *H01L 27/11524* (2013.01); *H01L 27/11551* (2013.01); *H01L 27/11578* (2013.01)

(58) Field of Classification Search
None
See application file for complete search history.

(56) References Cited

U.S. PATENT DOCUMENTS 9,484,353 B1 * 11/2016 Lai ................... H01L 27/11556
2015/0041879 A1 * 2/2015 Jayanti ............. H01L 21/28282
257/324

* cited by examiner

*Primary Examiner* — Reema Patel
(74) *Attorney, Agent, or Firm* — Anova Law Group, PLLC (57) ABSTRACT

A method is provided for fabricating a NAND flash memory. The method includes providing a semiconductor substrate having an isolation material layer formed on the semiconductor substrate, a selection gate material layer formed on the isolation material layer, and a plurality of alternately stacked gate dielectric material layers and control gate material layers formed on the selection gate material layer; forming a hard mask layer having a plurality of openings on a surface of the uppermost control gate material layer; forming a stacked gate structure on the semiconductor substrate, wherein the stacked gate structure includes a selection gate on the semiconductor substrate and control gates on the selection gate, and a width of the stacked gate structure is the same as a width of the hard mask layer on a top surface of the stacked gate structure; isolating the selection gate and the control gates by a gate dielectric layer.

20 Claims, 4 Drawing Sheets

(51) Int. Cl.
*H01L 27/11578* (2017.01)
*H01L 21/311* (2006.01)

NAND FLASH MEMORY AND FABRICATION METHOD THEREOF

CROSS-REFERENCES TO RELATED APPLICATIONS

This application claims the priority of Chinese patent application No. 201610005469.3, filed on Jan. 4, 2016, the entirety of which is incorporated herein by reference.

FIELD OF THE INVENTION

The present invention generally relates to the field of semiconductor manufacturing technology and, more particularly, relates to a NAND flash memory and fabrication techniques thereof.

BACKGROUND

The development of flash memory has been particularly rapid in recent years. Flash memory is a type of long-term non-volatile storage technology that does not require power to retain data, and has the advantages of high integration, fast access speed and easy to erase and rewrite. Therefore, it has a wide range of applications in many fields such as microcomputer, and automatic control, etc. To further increase the bit density in flash memory and, at the same time, to lower bit cost, a 3D NAND flash memory is proposed.

Figure 1:
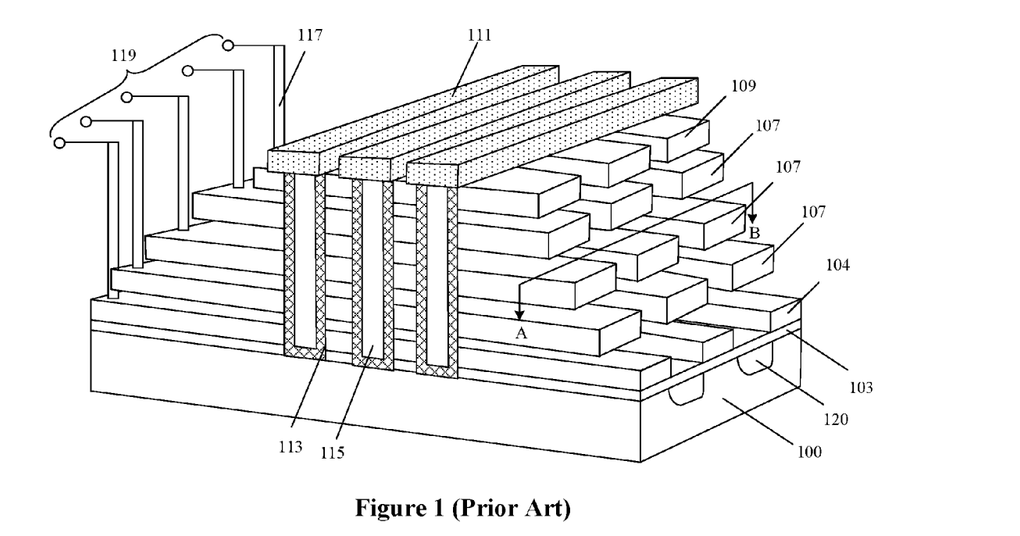
FIGS. 1-2 illustrate certain NAND flash memory structures corresponding to an existing fabrication process of a NAND flash memory.
Figure 2:
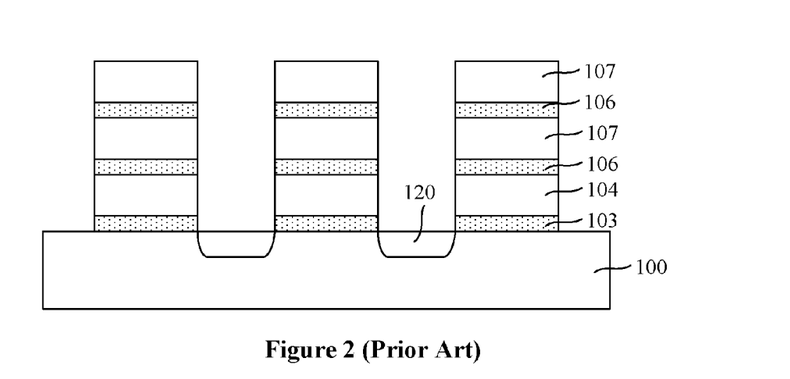

Referring to FIGS. 1-2, where FIG. 2 is a schematic diagram of a NAND flash memory shown in FIG. 1 along the cutting line in the AB direction, the NAND flash memory includes: a substrate 100; an isolation layer 103 formed on a surface of the substrate 100; a bottom selection gate 104 formed on the isolation layer 103; control gates 107 comprising a plurality of layers stacked together formed on the bottom selection gate 104; a top selection gate 109 formed on the control gates 107; a source line doping region 120 formed in the substrate between two adjacent rows of overlapping arrangement of the bottom selection gate 104, the control gates 107 and the top selection gate 109; a channel through hole (not labeled) penetrating the top selection gate 109, the control gates 107, the bottom selection gate 104 and the isolation layer 103; a channel layer 113 formed at side surfaces of the channel through hole; an insulation layer 115 formed on surface of the channel layer 113 in the channel through hole, where the insulation layer 115 fully fills the channel through hole; a bit line 111 formed on top surface of the channel layer 113; word line plugs 117 formed on the surface of each layer of the control gates 107; and word lines 119 formed on top of the word line plugs 117.

The adjacent bottom selection gate 104, control gates 107, top selection gate 109 and bit line 111 are isolated from each other by dielectric layers 106, which are not shown in FIG. 1.

However, the performance of such NAND flash memory fabricated with such existing techniques still needs to be improved. The disclosed device structures and methods are directed to solve one or more problems set forth above and other problems.

BRIEF SUMMARY OF THE DISCLOSURE

One aspect of the present disclosure includes a method for fabricating a NAND flash memory. The method includes providing a semiconductor substrate having an isolation material layer formed on the semiconductor substrate, a selection gate material layer formed on the isolation material layer, and a plurality of alternately stacked gate dielectric material layers and control gate material layers formed on the selection gate material layer; and forming a hard mask layer having a plurality of openings on a surface of the uppermost control gate material layer. The method also includes forming a stacked gate structure on the semiconductor substrate, wherein the stacked gate structure includes a selection gate on the semiconductor substrate and control gates on the selection gate, and a width of the stacked gate structure may be the same as a width of the hard mask layer on a top surface of the stacked gate structure; isolating the selection gate and the control gates by a gate dielectric layer; and forming a notch between the adjacent stacked gate structures. Further, the method includes removing part of a width of the selection gate and part of a width of the control gates by using the hard mask layer as a mask to perform a back-etching process onto the stacked gate structure, such that a spacing between the adjacent selection gates and a spacing between the adjacent control gates can be larger than a spacing between the adjacent hard mask layers and a spacing between the adjacent gate dielectric layers. Further, the method also includes performing a deposition process to form a dielectric layer filling the notch, wherein air gaps are formed in the dielectric layer between the adjacent selection gates and between the adjacent control gates.

Other aspects of the present disclosure can be understood by those skilled in the art in light of the description, the claims, and the drawings of the present disclosure.

DETAILED DESCRIPTION

As explained in the background section, the performance of NAND flash memory fabricated with existing techniques needs to be improved. For example, there often exist differences between operational states of adjacent memory cells when such NAND flash memory is in operation.

In order to achieve a high-level integration, a distance between adjacent memory cells (such as distance between the adjacent selection gates or distance between the adjacent control gates) becomes small. Device-to-device RC delay can appear between adjacent memory cells. Therefore, an operation (such as write, read or erase operation) of a memory cell may affect an operation (such as write, read or erase operation) of adjacent memory cells.

According to the disclosed device structures and method, the device-to-device RC delay issue and the other issues may be overcome by forming an air gap between the adjacent selection gates and between the adjacent control gates to avoid mutual influence of the adjacent memory cells.

Reference will now be made in detail to exemplify embodiments of the invention, which are illustrated in the accompanying drawings. Wherever possible, the same reference numbers will be used throughout the drawings to refer to the same or alike parts.

Figure 6:
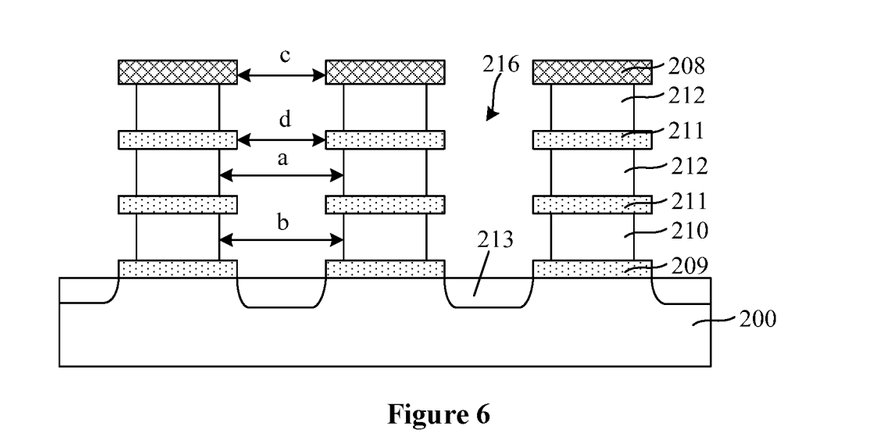
Figure 7:
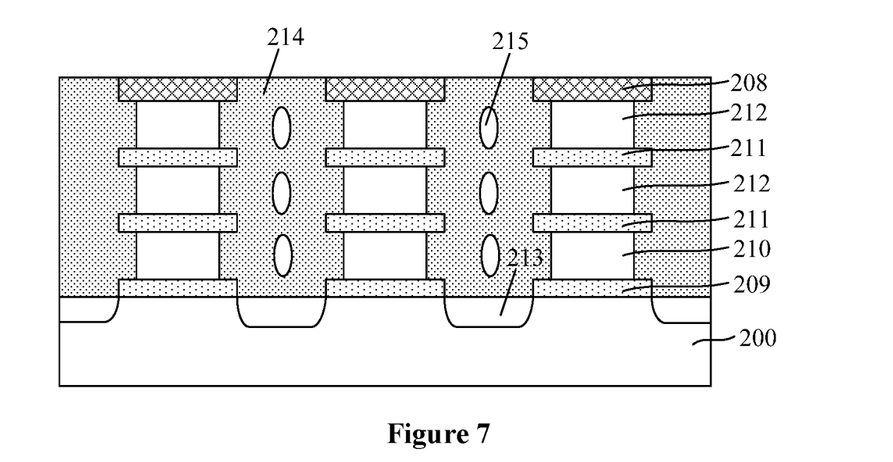
Figure 8:
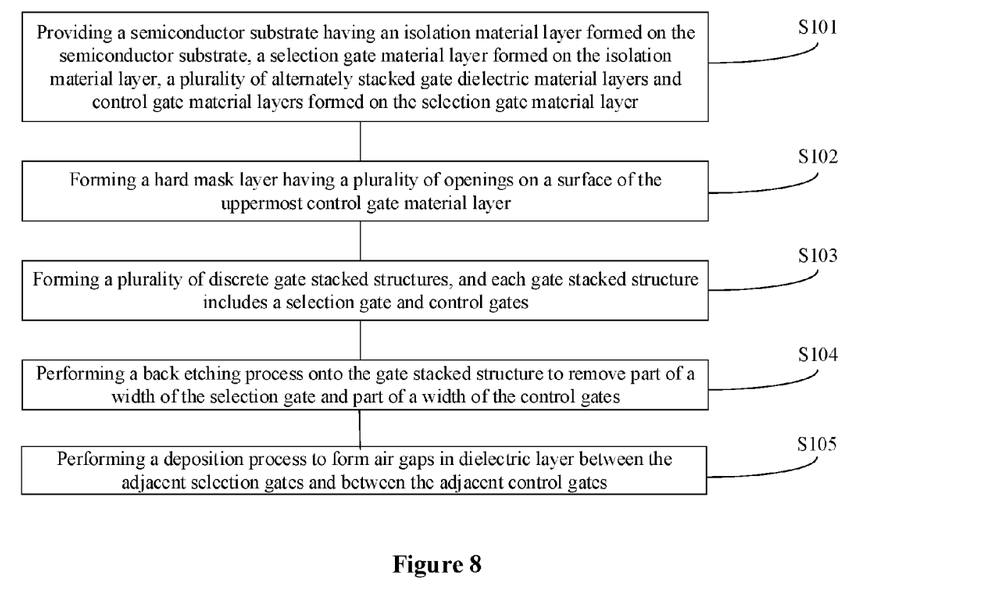
FIG. 8 illustrates an exemplary NAND flash memory fabrication process consistent with the disclosed embodiments.

FIG. 8 illustrates an exemplary NAND flash memory fabrication process consistent with the disclosed embodiments; and FIGS. 3-7 illustrate NAND flash memory structures corresponding to certain stages of the exemplary fabrication process.

Figure 3:
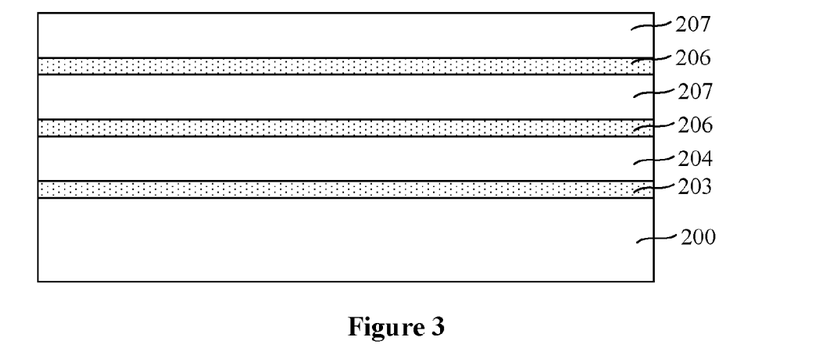
FIGS. 3-7 illustrate NAND flash memory structures corresponding to certain stages of a fabrication process of a NAND flash memory consistent with the disclosed embodiments.

As shown in FIG. 8, at the beginning of the fabrication process, a semiconductor substrate with certain structures is provided (S101). FIG. 3 illustrates a corresponding NAND flash memory structure.

Referring to FIG. 3, a semiconductor substrate 200 may be provided. The semiconductor substrate 200 may be a carrier of subsequent processes and may include any appropriate material, such as silicon (Si), germanium (Ge), germanium-silicon alloy (GeSi), silicon carbide (SiC), silicon on insulator (SOI), germanium on insulator (GOI), or gallium arsenide (GaAs) and other III-V compounds thereof.

As shown in FIG. 3, further, an isolation material layer 203 may be formed on the semiconductor substrate 200. A selection gate material layer 204 may be formed on the isolation material layer 203. A plurality of alternately stacked gate dielectric material layers 206 and control gate material layers 207 may be formed on the selection gate material layer 204, and each layer of the control gate material layers 207 may be correspondingly disposed on a surface of each layer of the gate dielectric material layers 206. The isolation material layer 203 may be subsequently used for forming isolation layers, and the selection gate material layer 204 may be subsequently used for forming selection gates. Further, the gate dielectric material layers 206 may be subsequently used for forming gate dielectric layers, and the control gate material layers 207 may be subsequently used for forming control gates.

The isolation material layer 203 may be made of any appropriate materials, such as silicon oxide, silicon nitride, or silicon oxynitride, etc. In one embodiment, the isolation material layer 203 may be made of silicon oxide. The control gate material layers and the selection gate material layer may be made of any appropriate materials, such as polysilicon, or metal, etc. In one embodiment, the control gate material layers and the selection gate material layer may be made of polysilicon.

The gate dielectric material layers 206 may have a single layer or multilayer (i.e., the number of layers being equal to or larger than two) stacked structure. When the gate dielectric material layers 206 are a single layered structure, in one embodiment, the gate dielectric material layers 206 are made of silicon oxide. When the gate dielectric material layers 206 are a multilayered (≥2 layers) stacked structure, in one embodiment, the gate dielectric material layers 206 are a three-layer stacked structure, including a first silicon oxide layer, a silicon nitride layer on a surface of the first silicon oxide layer, and a second silicon oxide layer on a surface of the silicon nitride layer.

The number of layers of the gate dielectric material layers 206 and the control gate material layers 207 may be at least one. In one embodiment, the number of layers of the gate dielectric material layers 206 and the control gate material layers 207 may be at least two. For example, the gate dielectric material layers 206 and the control gate material layers 207 stack alternatingly with each other, including a first gate dielectric material layer formed on the selection gate material layer 204, a first control gate material layer formed on the first gate dielectric material layer, a second gate dielectric material layer formed on the first control gate material layer, and a second control gate material layer formed on the second gate dielectric material layer.

In other certain embodiments, a top gate dielectric material layer may be formed on a surface of the uppermost control gate material layer 207 and a top selection gate material layer may be formed on the top gate dielectric material layer. The top gate dielectric material layer may be subsequently used for forming top gate dielectric layers and the top selection gate material layer may be subsequently used for forming top selection gate layers.

Figure 4:
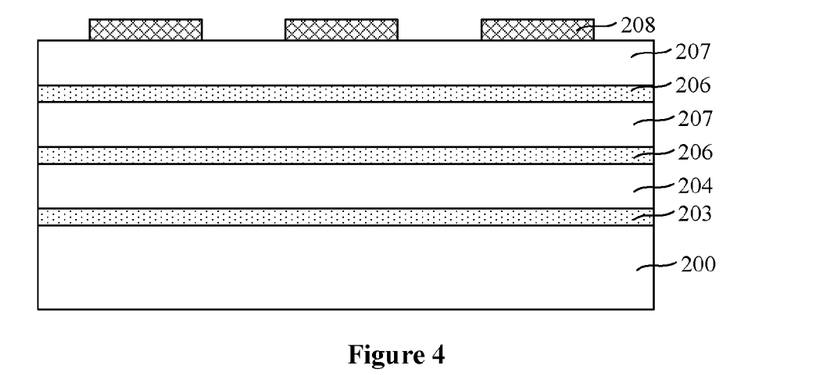

Returning to FIG. 8, after providing the substrate 200 with the isolation material layer, the selection gate material layer, the gate dielectric material layers, and the control gate material layers, a hard mask layer having a plurality of openings is formed (S102). FIG. 4 illustrates a corresponding NAND flash memory structure.

Referring to FIG. 4, a hard mask layer 208 may be formed on the surface of the uppermost control gate material layer 207 and may have a plurality of openings for exposing the surface of the uppermost control gate material layer 207.

The hard mask layer 208 may have a single layered or a multilayered (i.e., the number of layers being equal to or greater than two) stacked structure. When the hard mask layer 208 is a single layered structure, in one embodiment, the hard mask layer 208 may be made of silicon oxide, silicon nitride, silicon oxynitride, or silicon carbide, etc. When the hard mask layer 208 is a multilayered stacked structure, in one embodiment, the hard mask layer 208 may be a two-layer stacked structure, including a first mask layer and a second mask layer formed on a surface of the first mask layer. The first mask layer and the second mask layer are made of different materials. The first mask layer and the second mask layer are made of $SiO_2$, SiN, SiON, SiCN, SiC, TiN, or TaN, etc.

When a subsequent etching process is performed, the etched amount of the hard mask layer may be substantially small, such that the width of the openings in the hard mask layer can be kept consistent before and after the etching process. Thus, the width of subsequently formed stacked gate structure can be consistent with the width of the hard mask layer. After performing a subsequent back-etching process on the selection gates and the control gates, the spacing between the adjacent selection gates may be consistent with the spacing between the adjacent control gates and may be larger than the spacing between the adjacent hard mask layers. The configurations are desired for the formation of air gaps between the adjacent selection gates and the adjacent control gates during a deposition process for forming dielectric layers.

The hard mask layer 208 may be formed by a deposition process and the plurality of openings in the hard mask layer may be formed by a photolithography process and an etching process. The position and width of the hard mask layer 208 are consistent with or the same as the position and width of the subsequently formed stacked gate structure.

In other certain embodiments, when the top selection gate material layer is formed, correspondingly the hard mask layer may be formed on a surface of the top selection gate material layer.

Figure 5:
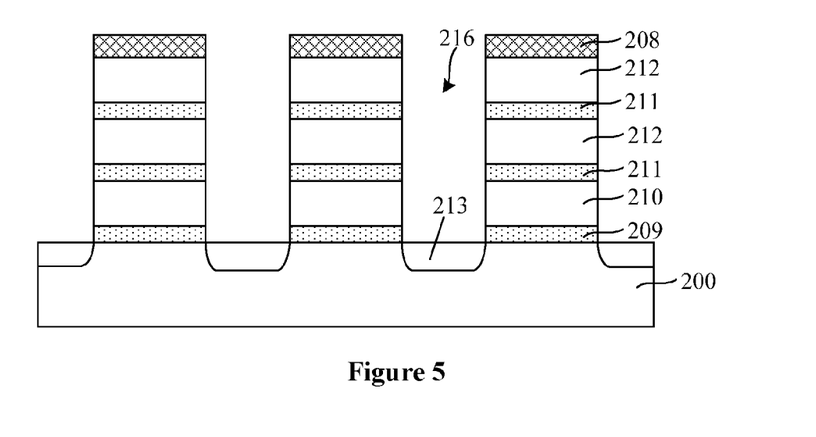

Returning to FIG. 8, after forming the hard mask layer having the plurality of openings, a plurality of discrete stacked gate structures may be formed, and each stacked gate structure includes a selection gate and control gates (S103). FIG. 5 illustrates a corresponding NAND flash memory structure.

Referring to FIG. 5, using the hard mask layer as a mask to sequentially etch the control gate material layers 207, the gate dielectric material layers 206, the selection gate material layer 204 and the isolation material layer 203 to form a plurality of discrete stacked gate structures on the semiconductor substrate 200 and to form a notch 216 between the adjacent stacked gate structures. Each stacked gate structure may include a selection gate 210 on the semiconductor substrate and control gates 212 on the selection gate 210, and the selection gate 210 and the control gates 212 may be isolated by a gate dielectric layer 211. The width of the stacked gate structure may be the same as the width of the hard mask layer on a top surface of the stacked gate structure.

An anisotropic dry etching process may be performed onto the control gate material layers 207, the gate dielectric material layers 206, the selection gate material layer 204 and the isolation material layer 203, such that the width of the upper and the lower part of the stacked gate structure can be kept consistent. In one embodiment, the anisotropic dry etching process may be a plasma etching process. During the plasma etching, the chamber pressure may be in a range of approximately 5-50 mTorr; the RF power may be in a range of approximately 500-1500 W; the temperature may be in a range of approximately 40-100° C.; and the bias power may be in a range of approximately 0-100 W. Further, the flow rate of $CF_4$ gas may be in a range of approximately 20-200 sccm; the flow rate of HBr gas may be in a range of approximately 50-1000 sccm; the flow rate of He gas may be in a range of approximately 200-1000 sccm; and the flow rate of $O_2$ gas may be in a range of approximately 5-20 sccm.

The number of layers of the formed control gates 212 may be at least one. When the number of layers of the control gates 212 is greater than two, the gate dielectric layer 211 may be used to isolate the adjacent control gates 212 and to isolate the lowermost control gate 212 and the selection gate 210.

In other certain embodiments, when the top selection gate material layer is formed, correspondingly a top selection gate may be formed by etching the top selection gate material layer. Each stacked gate structure also includes the top selection gate on the uppermost control gate.

Returning to FIG. 8, after forming the stacked gate structure including the selection gate and the control gates, a back-etching process may be performed onto the stacked gate structure to remove part of width of the selection gate and part of width of the control gates (S104). FIG. 6 illustrates a corresponding NAND flash memory structure.

Referring to FIG. 6, using the hard mask layer 208 as a mask, a back etching process may be performed to remove part of width of the selection gate 210 and part of width of the control gates 212. Thus, the spacing or distance "b" between the adjacent selection gates 210 and the spacing or distance "a" between the adjacent control gates 212 are larger than the spacing or distance "c" between the adjacent hard mask layers 208.

In one embodiment, by using the back-etching process to remove part of the width of the selection gate 212 and part of the width of the control gates 210, the spacing "b" between the adjacent selection gates 210 and the spacing "a" between the adjacent control gates 212 may be greater than the spacing "c" between the adjacent hard mask layers 208. Further, the spacing "b" between the adjacent selection gates 210 and the spacing "a" between the adjacent control gates 212 may be greater than the spacing "d" between the adjacent gate dielectric layers 211. The width of the openings in the hard mask layer 208 (or the spacing between the adjacent hard mask layers 208) and the width of the openings in the gate dielectric layer 211 (or the spacing between the adjacent gate dielectric layers 211) may be consistent or have little changes before and after the back-etching process.

When a deposition process is subsequently performed onto the notch 216 to form a dielectric layer, dielectric material may be deposited layer by layer. As the deposition process continues, the spaces with smaller spacing between the adjacent hard mask layers 208 and between the adjacent gate dielectric layers 211 may be completely filled first, while the spaces with larger spacing between the adjacent selection gates 210 and between the adjacent control gates 212 are not completely filled. Therefore, air gaps are easily formed in the dielectric layer between the adjacent selection gates 210 and between the adjacent control gates 212. The locations for forming the air gaps may be substantially accurate, just between the adjacent selection gates 210 and between the adjacent control gates 212.

The back-etching process for removing part of the width of the selection gate and part of the width of the control gates may be a wet etching process or an isotropic dry etching process.

An etching solution used in the wet etching process may be a Tetramethylammonium Hydroxide (TMAH) solution or an $NH_3H_2O$ solution, and a gas used in the isotropic dry etching process may be HCl. In one embodiment, when the wet etching is performed with the TMAH solution: the mass percentage concentration of the TMAH solution may be in a range of approximately 0.5%-20%, the wet etching temperature may be in a range of approximately 0-80° C., and the wet etching time may be in a range of approximately 10-300 seconds. In another embodiment, when the wet etching is performed with the $NH_3H_2O$ solution: the mass percentage concentration of the $NH_3H_2O$ solution may be in a range of approximately 1%-50%, the wet etching temperature may be in a range of approximately 0-80° C., and the wet etching time may be in a range of approximately 10-300 seconds.

In other certain embodiments, when the isotropic dry etching process is performed, the flow rate of HCl may be in a range of approximately 5 sccm-5 slm, the etching chamber temperature may be in a range of approximately 23-1100° C., the etching chamber pressure may be in a range of approximately 5-760 Torr, and the dry etching time may be in a range of approximately 10-300 seconds. To accurately control the back etched width of the selection gate 210 and the control gates 212, especially for the control gates 212 having a multilayer structure, where the back etched width of each layer of the control gates 212 is consistent, to ensure the performance of the control gates at different locations is consistent, the hard mask layer 208 and the gate dielectric layer 211 should be neither over-etched nor under-etched in the etching process.

The back etched width of the selection gate 210 and the control gates 212 should not be too small. If the back etched width is too small, the difference between the spacing between the adjacent selection gates 210 (and the spacing between the adjacent control gates 212) and the spacing between the adjacent hard mask layers is too small, it may be difficult to form air gaps during subsequently forming a dielectric layer.

The back etched width of the selection gate 210 and the control gates 212 should not be too large either. If the back etched width is too large, the remaining width of the selection gate 210 and the control gates 212 may be too small. As a result, the performance of the selection gate and the control gates may be affected. Moreover, sidewalls of the remaining selection gate and the remaining control gates are may not be easily covered by the dielectric layer, increasing the difficulty of the fabrication process.

In one embodiment, the back etched width of the selection gate and the control gates may be in a range of approximately 10-200 Å, which may include 10 Å, 15 Å, 20 Å, 25 Å, 30 Å, 40 Å, 50 Å, 60 Å, 80 Å, 100 Å, 120 Å, 140 Å, 150 Å, 160 Å, 170 Å, 180 Å, 185 Å, 190 Å, 195 Å, and 200 Å.

In one embodiment, when the top selection gate is formed, corresponding part of a width of the top selection gate may be back etched to have a spacing between the adjacent top selection gates been larger than the spacing between the adjacent hard mask layers 208.

Returning to FIG. 8, after removing part of the width of the selection gate and part of the width of the control gates, a deposition process may be performed to form a dielectric layer and air gaps (S105). FIG. 7 illustrates a corresponding NAND flash memory structure.

Referring to FIG. 7, after performing the back-etching process, a deposition process may be performed to form a dielectric layer 214 filling the notch and to form air gaps 215 in the dielectric layer 214 between the adjacent selection gates 210 and between the adjacent control gates 212.

The deposition process may be an atomic layer deposition (ALD) process. When the atomic layer deposition process is performed, because the dielectric material is formed layer-by-layer until the dielectric layer is finally formed, the deposition process may be well controlled. Through the difference between the spacing between the adjacent control gates (and the spacing between the adjacent selection gates) and the spacing between the adjacent hard mask layers, the air gaps 215 can be easily formed in the dielectric layer 214 between the adjacent selection gates 210 and between the adjacent control gates 212.

The air gaps 215 may effectively reduce the value of the dielectric constant of the dielectric layer between the adjacent control gates 212 and between the adjacent selection gates 210, and reduce the parasitic capacitance of the adjacent control gates 212 and the adjacent selection gates 210. Further, the air gaps 215 effectively reduce the RC delay between a device to its adjacent device (such as a selection gate to an adjacent selection gate or a control gate to an adjacent control gate) to avoid the mutual influence of adjacent memory cells in operation (such as write, read or erase operation). The air gaps 215 formed on different locations have uniform size and greater positional accuracy, such that the dielectric constant of the dielectric layers at different locations between the adjacent control gates 212 and between the adjacent selection gates 210 can be kept consistent, and the performance of memory cells at different locations can also be consistent.

The dielectric layer 214 may be made of any appropriate material, such as $SiO_2$, SiON, SiOCN, or SiOBN, etc. In one embodiment, the dielectric layer 214 may be made of $SiO_2$.

When the dielectric layer 214 is made of $SiO_2$, the atomic layer deposition process may include: introducing a silicon source gas; applying an RF power to dissociate the silicon source gas and to form a silicon source plasma, which can form the first reactant on surfaces of sidewalls and bottom of the notch and on the surface of the stacked gate structure; discharging the residual silicon source plasma from the chamber; introducing an oxygen source gas; applying an RF power to dissociate the oxygen source gas and to form an oxygen source plasma, which reacts with the first reactant to form a silicon oxide atomic layer; and discharging the residual oxygen source plasma and reaction byproducts from the chamber. Further, these steps may be repeated to form a plurality of stacked layers of the silicon oxide atomic layer to form the dielectric layer.

In one embodiment, the silicon source gas used in the atomic layer deposition process may be methyl diethoxy silane, siloxane octamethylcyclotetrasiloxane, tetraethoxysilane, $SiH_4$, $Si_2H_6$, $Si_2Cl_6$, or $SiH_2Cl_2$, etc; the flow rate of the silicon source gas may be in a range of approximately 60-800 sccm; the oxygen source gas may be $O_2$ or $O_3$; and the flow rate of the oxygen source gas may be in a range of approximately 20-300 sccm. Further, the deposition chamber pressure may be in a range of approximately 0.1-1 Torr; the deposition chamber RF power may be in a range of approximately 200-3000 W; and the deposition chamber temperature may be in a range of approximately 50-800° C. The atomic layer deposition process may improve the easiness of forming the air gaps 215 in the dielectric layer 214 between the adjacent selection gates 210 and in the dielectric layer 214 between the adjacent control gates 212, and may improves the position accuracy and size uniformity of the air gaps.

In one embodiment, before forming the dielectric layer 214, a thermal oxide layer may be formed on side surfaces of the selection gate 210 and the control gates 212 to repair the possible damages caused by the back-etching process. A process for forming the thermal oxide layer may be a rapid thermal annealing process or a furnace oxidation process.

In one embodiment, when the top selection gate is formed, correspondingly the air gaps may be formed in the dielectric layer between the adjacent top selection gates.

In one embodiment, the method for fabricating a NAND flash memory may also include: forming a channel through hole penetrating (the top selection gate) the control gates, the gate dielectric layers, the selection gate and the isolation layer; forming a channel layer at side surfaces of the channel through hole; forming an insulation layer on a surface of the channel layer in the channel through hole, and the insulation layer completely filling the channel through hole; and forming a bit line on the top surface of the channel layer.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a NAND flash memory, comprising:
   providing a semiconductor substrate having an isolation material layer formed on the semiconductor substrate, a selection gate material layer formed on the isolation material layer, and a plurality of alternately stacked gate dielectric material layers and control gate material layers formed on the selection gate material layer;
   forming a hard mask layer having a plurality of openings on a surface of the uppermost control gate material layer;
   forming a stacked gate structure on the semiconductor substrate, wherein the stacked gate structure includes a selection gate on the semiconductor substrate and control gates on the selection gate, and a width of the stacked gate structure is the same as a width of the hard mask layer on a top surface of the stacked gate structure;

isolating the selection gate and the control gates by a gate dielectric layer;

forming a notch between the adjacent stacked gate structures;

removing a part of a width of the selection gate and a part of a width of the control gates by using the hard mask layer as a mask to perform a back-etching process onto the stacked gate structure, such that a spacing between the adjacent selection gates and a spacing between the adjacent control gates can be larger than a spacing between the adjacent hard mask layers and a spacing between the adjacent gate dielectric layers; and performing a deposition process to form a dielectric layer filling the notch, wherein air gaps are formed in the dielectric layer between the adjacent selection gates and between the adjacent control gates.

2. The method according to claim 1, wherein:
a back etched width of the selection gate and the control gates is in a range of approximately 10-200 Å.

3. The method according to claim 1, wherein:
the back-etching process for removing part of the width of the selection gate and part of the width of the control gates is a wet etching process or an isotropic dry etching process.

4. The method according to claim 3, wherein:
an etching solution used in the wet etching process is a Tetramethylammonium Hydroxide (TMAH) solution or an $NH_3H_2O$ solution.

5. The method according to claim 4, wherein:
a mass percentage concentration of the TMAH solution is in a range of approximately 0.5%-20%;
a wet etching temperature is in a range of approximately 0-80° C.; and
a wet etching time is in a range of approximately 10-300 seconds.

6. The method according to claim 4, wherein:
a mass percentage concentration of the $NH_3H_2O$ solution is in a range of approximately 1%-50%;
a wet etching temperature is in a range of approximately 0-80° C.; and
a wet etching time is in a range of approximately 10-300 seconds.

7. The method according to claim 3, wherein:
a gas used in the isotropic dry etching process is HCl;
a flow rate of HCl is in a range of approximately 5 sccm-5 slm;
an etching chamber temperature is in a range of approximately 23-1100° C.;
an etching chamber pressure is in a range of approximately 5-760 Torr; and
a dry etching time is in a range of approximately 10-300 seconds.

8. The method according to claim 1, wherein:
the gate dielectric layer is made of $SiO_2$, SiON, SiOCN, or SiOBN.

9. The method according to claim 1, wherein:
the deposition process includes an atomic layer deposition process.

10. The method according to claim 9, wherein the atomic layer deposition process for forming the dielectric layer made of $SiO_2$ includes:
introducing a silicon source gas;

applying an RF power to dissociate the silicon source gas and to form a silicon source plasma, which can form a first reactant on surfaces of sidewalls and bottom of the notch and on surface of the stacked gate structure;

discharging residual silicon source plasma from a chamber;

introducing an oxygen source gas;

applying an RF power to dissociate the oxygen source gas and to form an oxygen source plasma, which reacts with the first reactant to form a silicon oxide atomic layer;

discharging residual oxygen source plasma and reaction byproducts from the chamber; and repeating these steps to form a plurality of stacked layers of the silicon oxide atomic layer to form the dielectric layer.

11. The method according to claim 10, wherein:
the silicon source gas is methyl diethoxy silane, siloxane octamethylcyclotetrasiloxane, tetraethoxysilane, $SiH_4$, $Si_2H_6$, $Si_2Cl_6$, or $SiH_2Cl_2$;
a flow rate of the silicon source gas is in a range of approximately 60-800 sccm;
the oxygen source gas is $O_2$ or $O_3$;
a flow rate of the oxygen source gas is in a range of approximately 20-300 sccm;
a deposition chamber pressure is in a range of approximately 0.1-1 Torr;
a deposition chamber RF power is in a range of approximately 200-3000 W; and
a deposition chamber temperature is in a range of approximately 50-800° C.

12. The method according to claim 1, before forming the dielectric layers, further including:
forming a thermal oxide layer on side surfaces of the selection gate and the control gates.

13. The method according to claim 12, wherein forming the thermal oxide layer further includes:
performing a rapid thermal annealing process or a furnace oxidation process on the side surfaces of the selection gate and the control gates to form the thermal oxide layer.

14. The method according to claim 1, wherein:
the selection gate and the control gates are made of polysilicon.

15. The method according to claim 1, further including:
forming an isolation layer between the selection gate and the semiconductor substrate.

16. The method according to claim 1, before removing part of the width of the selection gate and part of the width of the control gates by the back-etching process, further including:
forming source line doping regions in the semiconductor substrate at both sides of the gate stack structure.

17. The method according to claim 1, wherein:
the stacked gate structure also includes a top selection gate on the control gates.

18. The method according to claim 17, wherein:
the hard mask layer is on the top selection gate.

19. The method according to claim 18, wherein:
during performing the back-etching process, part of a width of the top selection gate is, at the same time, back etched and removed.

20. The method according to claim 19, wherein:
forming the air gaps in the dielectric layer between the adjacent top selection gates.

* * * * *